United States Patent
Yamamoto et al.

(10) Patent No.: US 6,731,116 B2
(45) Date of Patent: May 4, 2004

(54) SHORT-CIRCUIT DETECTOR

(75) Inventors: Masashi Yamamoto, Kyoto (JP); Kozo Maenishi, Kyoto (JP)

(73) Assignee: OMRON Corporation, Kyoto (JP)

( * ) Notice: Subject to any disclaimer, the term of this patent is extended or adjusted under 35 U.S.C. 154(b) by 51 days.

(21) Appl. No.: 10/232,768

(22) Filed: Aug. 29, 2002

(65) Prior Publication Data

US 2003/0042909 A1 Mar. 6, 2003

(30) Foreign Application Priority Data

Aug. 29, 2001 (JP) ........................... 2001-259841

(51) Int. Cl.[7] ................. G01R 31/00; G01R 31/14; G01R 31/08
(52) U.S. Cl. ................. 324/522; 324/503; 324/504
(58) Field of Search .................. 324/522, 424, 324/509, 525, 503, 510, 511, 512, 508, 526

(56) References Cited

U.S. PATENT DOCUMENTS

| | | | | |
|---|---|---|---|---|
| 4,417,202 A | * | 11/1983 | Pascoe | 324/509 |
| 4,929,901 A | | 5/1990 | Kimball et al. | 324/529 |
| 5,481,194 A | * | 1/1996 | Schantz et al. | 324/522 |
| 5,539,602 A | * | 7/1996 | Schmitz et al. | 361/42 |
| 5,818,236 A | * | 10/1998 | Sone et al. | 324/509 |

FOREIGN PATENT DOCUMENTS

| | | |
|---|---|---|
| DE | 2809596 | 9/1979 |
| DE | 3513846 | 10/1986 |
| EP | 0833423 | 4/1998 |
| JP | 06-153301 | 5/1994 |
| JP | 6-153303 | 5/1994 |
| JP | 6-308185 | 11/1994 |
| JP | 7-020185 | 1/1995 |
| JP | 8-163704 | 6/1996 |
| JP | 08-294225 | 11/1996 |

* cited by examiner

*Primary Examiner*—N. Le
*Assistant Examiner*—John Teresinski
(74) *Attorney, Agent, or Firm*—Beyer Weaver & Thomas LLP

(57) ABSTRACT

A short-circuit detector has connected between positive and negative terminals of a DC power source a series connection including sequentially a first switch, a first detection resistor, a second detection resistor and a second switch, a third switch between a grounding terminal such as a vehicle chassis and a point between the first and second detection resistors and a voltage detector circuit connected in parallel with the first and second detection resistors. A control circuit is connected to the voltage detector circuit, serving to calculate a voltage value of the DC power source by switching on only the first and second switches, to calculate a first voltage drop value across the first detection resistor by switching on only the first and third switches, to calculate a second voltage drop value across the second detection resistor by switching on only the second and third switches and to determine presence or absence of short-circuited conditions at the positive and negative terminals of the DC power source on the basis of the calculated voltage value, the first voltage drop value and the second voltage drop value.

8 Claims, 2 Drawing Sheets

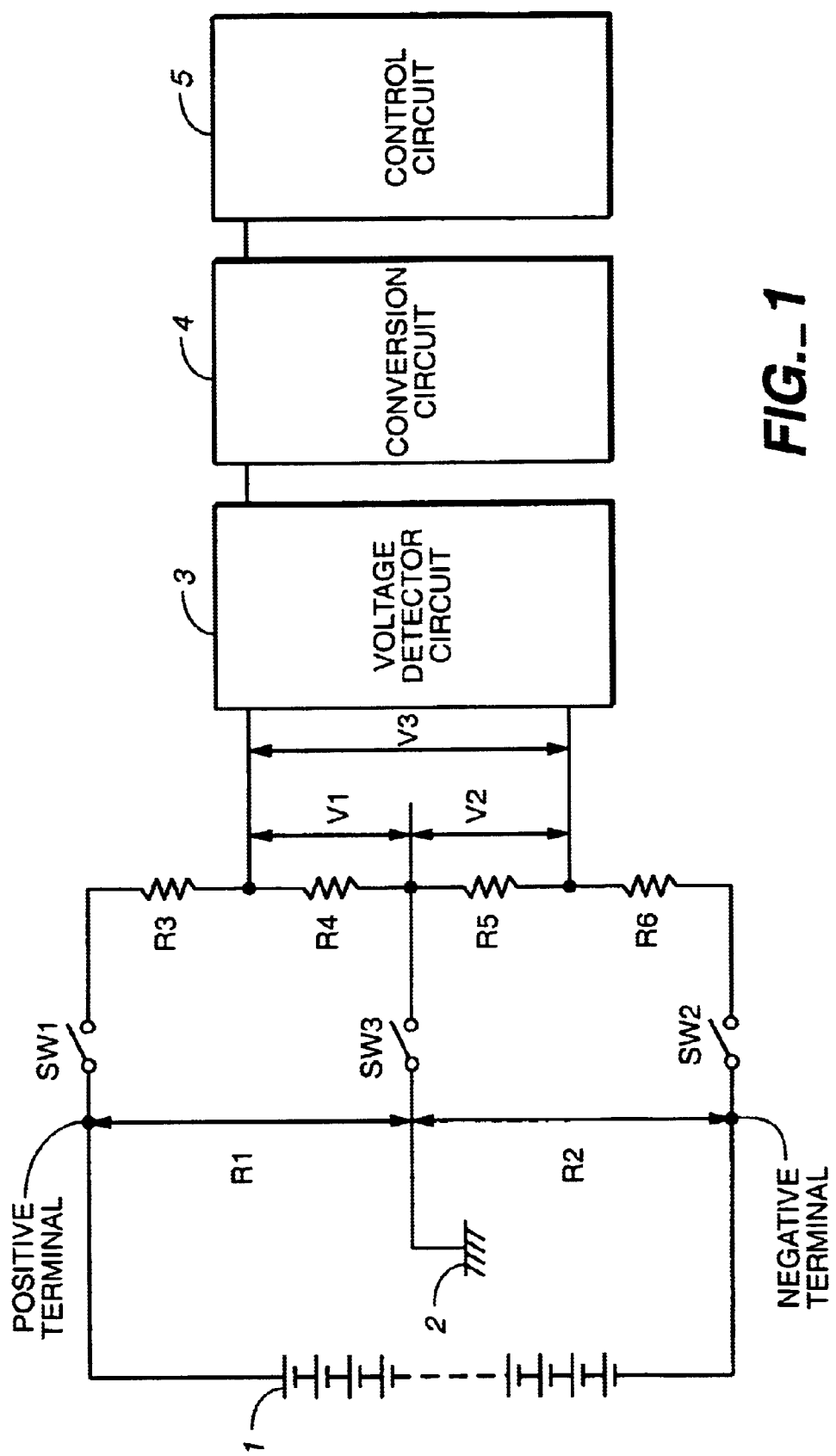
FIG._1

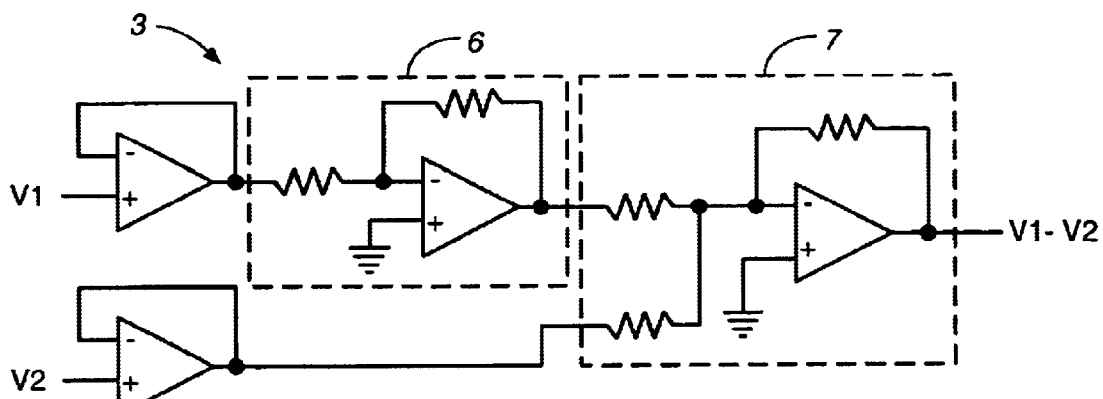
FIG._2
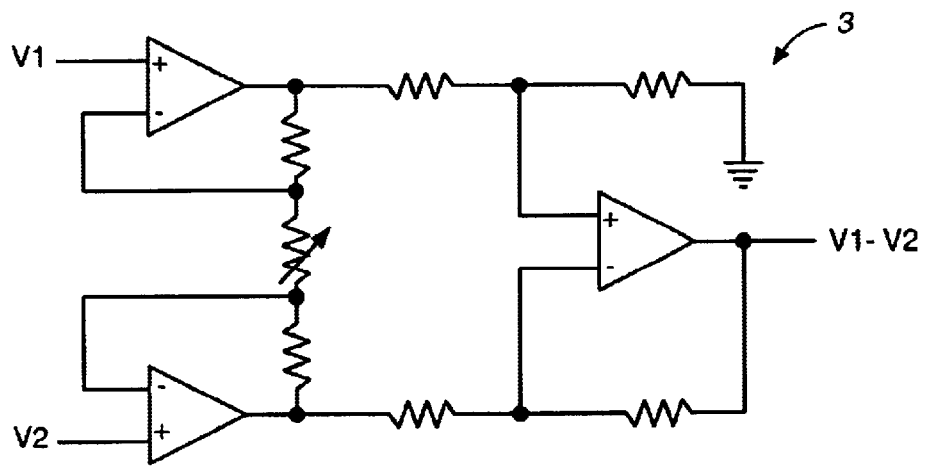
FIG._3
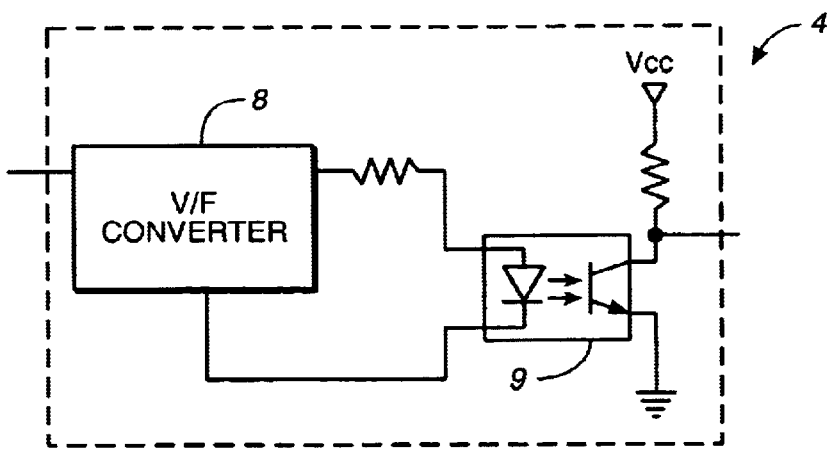
FIG._4

SHORT-CIRCUIT DETECTOR

BACKGROUND OF THE INVENTION

This invention relates to a short-circuit detector.

Since electric cars carry an electric power source of a very high voltage (about 400V), it has been proposed that a short-circuit detector be also provided. Japanese Patent Publication Tokkai 8-163704 disclosed a device adapted to detect a short circuit by connecting a relay junction to a terminal of each polarity of a high-voltage DC source and closing only one of them to detect a short circuit on the basis of a voltage drop in a detection resistor. As a second example, Japanese Patent 3041150 (Tokkai 7-20185) disclosed a detector having detection resistors connected in series between the terminals of a high-voltage DC source each through a protection resistor and detecting a short circuit at each terminal on the basis of the difference between the voltage drops in the detection resistors. As a third example, Japanese Patent 2838462 (Tokkai 6-153303) disclosed a device adapted to detect the leakage on the side of each terminal by operating a switch to measure the voltages generated across detection resistors on both sides of a high-voltage DC source. As a fourth example, Japanese Patent 3107944 (Tokkai 6-308185) disclosed a device having a protection resistor and a detection resistor connected to each terminal of a high-voltage DC source and a switch connected in parallel with each of the protection resistors such that a short circuit can be detected by switching on and off these switches.

If short circuits occur on the sides of both terminals simultaneously, however, detectors of the first three kinds cannot detect them. Detectors of the first example are not provided with means for measuring the source voltage and hence cannot detect a short circuit accurately because of the effect of variations in the source voltage. Detectors according to the second and fourth examples are not desirable from the point of view of safety because the high-voltage source is always in a connected condition with the body of the vehicle.

SUMMARY OF THE INVENTION

It is therefore an object of this invention to provide a safely operable short-circuit detector capable of dependably detecting a short circuit even in the presence of variations in the source voltage.

A short-circuit detector embodying this invention may be characterized as having a series connection including sequentially a first switch, a first detection resistor, a second detection resistor and a second switch, connected between a positive terminal and a negative terminal of a high-voltage DC power source, a third switch between a grounding terminal such as a vehicle chassis and a point between the first detection resistor and the second detection resistor, and a voltage detector circuit connected in parallel with the first and second detection resistors. A control circuit is further connected to the voltage detector circuit, serving to calculate a voltage value of the DC power source by switching on only the first switch and the second switch, to calculate a first voltage drop value across the first detection resistor by switching on only the first switch and the third switch, to calculate a second voltage drop value across the second detection resistor by switching on only the second switch and the third switch, and to determine presence or absence of short-circuited conditions at the positive terminal and the negative terminal of the DC power source on the basis of the calculated voltage value, the first voltage drop value and the second voltage drop value.

Correspondingly, a method of detecting a short-circuit condition embodying this invention may be characterized as comprising the steps of connecting the positive and negative terminals of a DC power source with a series connection including sequentially a first switch, a first detection resistor, a second detection resistor and a second switch, connecting a third switch between a grounding terminal such as a vehicle chassis and a point between the first detection resistor and the second detection resistor, connecting a voltage detector circuit in parallel with the first and second detection resistors, calculating a voltage value of the DC power source by switching on only the first switch and the second switch, calculating a first voltage drop value across the first detection resistor by switching on only the first switch and the third switch, calculating a second voltage drop value across the second detection resistor by switching on only the second switch and the third switch, and determining presence or absence of short-circuited conditions at the positive terminal and the negative terminal of the DC power source on the basis of the calculated voltage value, the first voltage drop value and the second voltage drop value.

With the detector and method according to this invention, the voltage value of the DC power source can be calculated by switching on the first and second switches together. Next, only the first and third switches are switched on and only the second and third switches are switched on. The leakage resistance values to the grounding terminal such as the chassis of a vehicle are calculated on the basis of the voltage drops across the second and third detection resistors.

BRIEF DESCRIPTION OF THE DRAWINGS

FIG. 1 is a block diagram of a short-circuit detector embodying this invention for showing its circuit structure.

FIG. 2 is an example of circuit diagram for the voltage detector circuit of FIG. 1.

FIG. 3 is another example of circuit diagram for the voltage detector circuit of FIG. 1.

FIG. 4 is a circuit diagram of the conversion circuit of FIG. 1.

DETAILED DESCRIPTION OF THE INVENTION

The invention is described next by way of an example with reference to drawings. FIG. 1 shows the circuit structure of a short-circuit detector embodying this invention which may be used for detecting the current leakage of a power battery 1 (a high-voltage DC source), for example, of an electric car, connected to a load such as a motor (not shown).

Connected in series from the positive terminal to the negative terminal of the battery 1 are a first switch SW1, a first protection resistor R3, a first detection resistor R4, a second detection resistor R5, a second protection resistor R6 and a second switch SW2. The junction between the first detection resistor R4 and the second detection resistor R5 is grounded, being connected to the chassis 2 of the car through a third switch SW3.

A voltage detector circuit 3 is provided for detecting the voltage drop V3 through the series connection of the first detection resistor R4 and the second detection resistor R5. The voltage detector circuit 3 is connected to a control circuit 5 through a circuit herein referred to as the conversion circuit 4 for converting the output of the voltage detector circuit 3 into a form that can be more easily processed by the control circuit 5, as will be explained more in detail below.

The voltage detector circuit 3 may be structured by combining an inversion amplifier circuit 6 and an adder circuit 7, as shown in FIG. 2, or by using a differential amplifier circuit to detect the differential of detected voltages, as shown in FIG. 3. The conversion circuit 4 may be structured, as shown in FIG. 4, with a voltage-frequency (V/F) converter 8 for converting the voltage outputted from the voltage detector circuit 3 into a pulse signal with a frequency proportional to the detected voltage and a photo-coupler 9 for transmitting the pulse signal to the control circuit 5 while the voltage detector circuit 3 in a high-voltage condition and the control circuit 5 in a low-voltage condition are maintained in a mutually insulated relationship. Alternatively, the conversion circuit 4 may be formed with an A/D converter for converting the voltage from the voltage detector circuit 3 into a digital signal.

The control circuit 5 may be formed with a CPU and software programs or a logical calculation circuit such as an ASIC. The control circuit 5 may be provided inside the short-circuit detector of this invention. Alternatively, a CPU or a logical calculation circuit (not shown) serving as an external device may be connected to the short-circuit detector of this invention to be used as its control unit.

In FIG. 1, R1 and R2 respectively indicate the leakage resistance on the plus side and the negative side when there is a leakage between the battery 1 and the vehicle chassis 2.

Next, the operations of the short-circuit detector described above will be explained. The detector is used to measure the voltage Vcc of the battery 1 and this measured value is used to obtain the leakage resistances R1 and R2. In order to simplify the calculations, it will be assumed R3=R6=Rb, R4=R5=Ra and Ra+Rb=Rs.

First, the first and second switches SW1 and SW2 are switched on while the third switch SW3 is switched off. The voltage detector circuit 3 is used to detect the voltage drop V3 across the first detection resistor R4 and the second detection resistor R5, and the voltage value Vcc of the battery 1 is calculated as Vcc=(Rs/Ra)V3.

Next, the first and third switches SW1 and SW3 are switched on and the second switch SW2 is switched off. Since the voltage drop V2 across the second detection resistor R5 becomes zero in this situation, the detected voltage V3 by the voltage detection circuit 3 becomes equal to the voltage drop V1 across the first detection resistor R4.

Similarly, the second and third switches SW2 and SW3 are switched on and the first switch SW1 is switched off. Since the voltage drop V1 across the first detection resistor R4 becomes zero in this situation, the detected voltage V3 by the voltage detection circuit 3 becomes equal to the voltage drop V2 across the second detection resistor R5.

Thus, the voltage drop across each of the detection resistors can be detected with a single voltage detector circuit 3 by switching on and off the three switches SW1, SW2 and SW3 in different combinations. Accordingly, the present invention can provide a short-circuit detector of a simple structure obtainable at a modest cost.

The leakage resistance values R1 and R2 on the positive and negative terminal sides of the battery 1 can be calculated by the formulas given below in terms of the calculated voltage value Vcc of the battery 1, the voltage drop V1a across the first detection resistor R4 when the second switch SW2 is switched off (when the effective voltage V2 across the second detection resistor R5 is zero and hence V3=V1a) and the voltage drop V2a across the second detection resistor R5 when the first switch SW1 is switched off (when the effective voltage V1 across the first detection resistor R4 is zero and hence V3=V2a):

$R1=\{Vcc \times Ra-(V1a+V2a)\times Rs\}/V2a$, and $R2=\{Vcc \times Ra-(V1a+V2a)\times Rs\}/V1a$.

If there is a leakage, the leakage resistance value R1 or R2 becomes much smaller than that when there is no leakage and hence the occurrence of a leakage can be detected easily.

In summary, since the actual voltage value Vcc of the battery 1 is detected by switching on the first and second switches SW1 and SW2, the presence or absence of a leakage can be dependably detected independent of any variations in the voltage value Vcc of the battery 1. Since a pair of switches is switched on only when the leakage is to be detected and all of the switches are kept in switched-off conditions when no detection is being taken, it is not at all times that the battery 1 on the high-voltage source side and the side of the vehicle chassis 2 are in a current-communicating relationship. Another advantage of the invention is that a leakage condition both on the positive and negative terminal sides can be detected merely by changing the conditions of the switches.

What is claimed is:

1. A short-circuit detector for a DC power source, said DC power source having a positive terminal and a negative terminal, said short-circuit detector comprising:
    a series connection including sequentially a first switch, a first detection resistor, a second detection resistor and a second switch, said series connection being connected between said positive terminal and said negative terminal;
    a third switch between a ground and a point between said first detection resistor and said second detection resistor;
    a voltage detector circuit connected in parallel with said first and second detection resistors; and
    a control circuit connected to said voltage detector circuit, said control circuit serving:
        to calculate a voltage value of said DC power source by switching on only said first switch and said second switch;
        to calculate a first voltage drop value across said first detection resistor by switching on only said first switch and said third switch;
        to calculate a second voltage drop value across said second detection resistor by switching on only said second switch and said third switch; and
        to determine presence or absence of short-circuited conditions at said positive terminal and said negative terminal of said DC power source from said calculated voltage value, said first voltage drop value and said second voltage drop value.

2. The short-circuit detector of claim 1 further comprising a conversion circuit connected between said voltage detector circuit and said control circuit and serves to insulate said control circuit from said voltage detector circuit and to transmit signals from said voltage detector to said control circuit.

3. The short-circuit detector of claim 2 wherein said DC power source is placed on a vehicle chassis and said third switch is connected between said vehicle chassis and said point between said first detection resistor and said second detection resistor.

4. The short-circuit detector of claim 1 wherein said DC power source is placed on a vehicle chassis and said third switch is connected between said vehicle chassis and said point between said first detection resistor and said second detection resistor.

5. A method of detecting a short-circuit condition of a DC power source, said DC power source having a positive terminal and a negative terminal, said method comprising the steps of:

connecting said positive terminal with said negative terminal with a series connection including sequentially a first switch, a first detection resistor, a second detection resistor and a second switch;

connecting a third switch between a ground and a point between said first detection resistor and said second detection resistor;

connecting a voltage detector circuit in parallel with said first and second detection resistors;

calculating a voltage value of said DC power source by switching on only said first switch and said second switch;

calculating a first voltage drop value across said first detection resistor by switching on only said first switch and said third switch;

calculating a second voltage drop value across said second detection resistor by switching on only said second switch and said third switch; and determining presence or absence of short-circuited conditions at said positive terminal and said negative terminal of said DC power source from said calculated voltage value, said first voltage drop value and said second voltage drop value.

6. The method of claim 5 further comprising the step of connecting a conversion circuit between said voltage detector circuit and said control circuit, said conversion circuit serving to insulate said control circuit from said voltage detector circuit and to transmit signals from said voltage detector to said control circuit.

7. The method of claim 6 wherein said DC power source is placed on a vehicle chassis and said third switch is connected between said vehicle chassis and said point between said first detection resistor and said second detection resistor.

8. The method of claim 5 wherein said DC power source is placed on a vehicle chassis and said third switch is connected between said vehicle chassis and said point between said first detection resistor and said second detection resistor.

* * * * *